United States Patent [19]

McCahill

[11] 4,291,376

[45] Sep. 22, 1981

[54] DIGITAL ENERGY MONITOR

[75] Inventor: David I. McCahill, Champion, Pa.

[73] Assignee: Three Rivers Enterprises, Inc., Pittsburgh, Pa.

[21] Appl. No.: 64,789

[22] Filed: Aug. 8, 1979

[51] Int. Cl.[3] ...................... G06F 15/20; G01R 21/06; G05B 15/00; H02J 3/14

[52] U.S. Cl. .................................... 364/483; 364/492; 324/113

[58] Field of Search ............... 364/492, 483, 556, 464; 324/113

[56] References Cited

U.S. PATENT DOCUMENTS

| | | | |
|---|---|---|---|
| 4,120,031 | 10/1978 | Kincheloe et al. | 364/483 X |
| 4,146,923 | 3/1979 | Borkan | 364/483 X |
| 4,162,530 | 7/1979 | Kusui et al. | 364/483 X |
| 4,168,491 | 9/1979 | Phillips et al. | 364/492 X |
| 4,179,654 | 12/1979 | Germer | 364/483 X |
| 4,199,717 | 4/1980 | Germer et al. | 364/483 X |

*Primary Examiner*—Edward J. Wise

*Attorney, Agent, or Firm*—Webb, Burden, Robinson & Webb

[57] ABSTRACT

A digital apparatus for generating an energy log for instant recall and display comprising a microcomputer including microprocessor with interrupt capability, programmable timer, keyboard and digital output. The apparatus is permanently programmed in read-only memory with a task to continuously update data and time information stored in read/write memory, a task to process each interrupt corresponding to pulsed signals indicative of energy usage and to add a unit to one memory location corresponding to that type of energy usage on a given date and a task to select and display time and date and to select and display functions of the contents of the memory locations corresponding to energy usage. The tasks are entirely interrupt activated.

6 Claims, 9 Drawing Figures

DIGITAL ENERGY MONITOR

BACKGROUND

Many new office buildings have a computerized energy management system. These systems are designed for use with very large computers and are much too expensive and elaborate for individual dwellings and small businesses.

The purpose of this invention is to provide a desk-top digital energy monitor for energy management which is small enough and inexpensive enough to be used in homes and small businesses. This system will continually log the user's consumption of electricity, natural gas, and/or fuel, for example, and will permit the user to instantly recall energy usage data and calculate the results of energy use options in terms of dollars and cents.

Low cost energy is no longer available and businesses and individual consumers are looking for ways to conserve energy. Unless users can monitor energy on at least a daily basis, they tend to put off energy conservation measures because they cannot immediately see or measure benefits. The apparatus according to this invention allows the user to constantly monitor energy usage. Thus the user can take immediate steps to reduce energy consumption or to experiment with energy saving appliances or devices or usage modes. For example, switching lights on and off over short periods may be shown to reduce energy consumption contrary to popular misconceptions. In another example, a small businessman can compare the electricity required to power one production tool with alternative production tools or experiment with other energy saving options to reduce overhead costs. The apparatus according to this invention can be used to recall energy consumption on a daily basis, year-to-date basis, or for whatever periods of usage desired so long as the periods comprise an integral number of days.

SUMMARY OF THE INVENTION

Briefly according to this invention, there is provided a digital apparatus comprising a microcomputer including a microprocessor having an interrupt capability with associated read-only memory, read/write memory, data, address and control buses. In addition, the microcomputer includes a timer connected with the microprocessor to provide continuous real-time and date data.

A keyboard and keyboard encoder are used for inputting data and control signals to the microprocessor, for example, for establishing certain initial conditions in the read/write memory and for selecting certain displays and functions. A display is connected to the microprocessor along with an interfacing display controller to enable output of information. Typically, the display comprises a plurality of four digit displays and a multiplexing display controller.

Preferably according to this invention, an interrupt controller is provided for fielding interrupts and identifying the particular interrupt to the system. For example, a programmable controller may be connected with said microprocessor. The controller has a plurality of input terminals connectable with the pulsed outputs of energy measuring devices. Each pulsed input to a selected terminal causes the interrupt controller to generate an interrupt signal to be passed to the microprocessor and a corresponding data bus output which is characteristic of the selected terminal.

The read-only memory associated with the microprocessor is permanently programmed for a totally interrupt initiated plurality of tasks. The tasks included, at least, a task to cause the microprocessor to have continuously updated date and time data stored at a selected location in the read/write memory, a task to process each interrupt corresponding to each pulsed input to add one unit to a read/write memory location corresponding to the date and the particular input terminal, and a task to select and display the contents of the memory locations corresponding to the time, date and energy usage. Preferably, the read-only memory is permanently programmed with tasks for typical mathematical operations such as addition, subtraction, multiplication, and division presented in a floating decimal format.

THE DRAWINGS

Further features and other objects and advantages of this invention will be understood from the following detailed description made with reference to the drawings, in which FIG. 1 is a pictorial view of a cabinet having a keyboard and display for enclosing the remaining portions of digital apparatus according to this invention, FIG. 2 is a schematic of a microcomputer according to this invention, FIG. 3 is a flow diagram of the main task stored in the read-only memory, FIG. 4 is a flow diagram illustrating the keyboard interrupt task stored in a read-only memory, FIG. 5 is a flow diagram of the general function task stored in read-only memory, FIG. 6 is a flow diagram of the date period selection task stored in read-only memory, FIG. 7 is a flow diagram of the energy function subtask stored in read-only memory, FIG. 8 is a flow diagram of the clock interrupt task stored in read-only memory, and FIG. 9 is a flow diagram of the energy interrupt task stored in read-only memory.

DESCRIPTION OF THE PREFERRED EMBODIMENT

Figure 1:
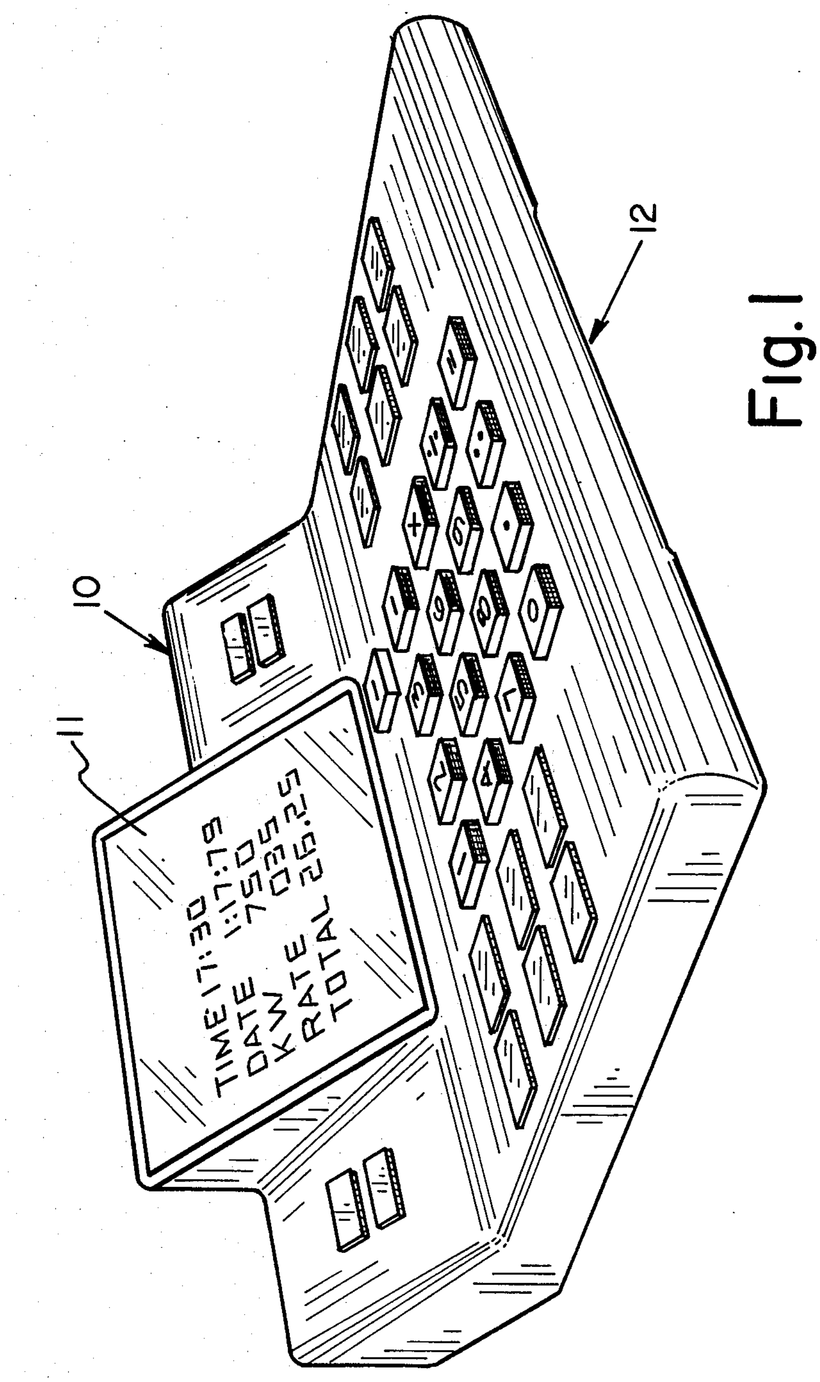

Referring now to FIG. 1, there is shown a cabinet 10 having mounted thereon a display board 11 and a plurality of touch operated keys comprising a typical calculator keyboard 12 including numeral keys (0 through 9, and decimal point), and function keys (plus, minus, times, divide, and equal). Preferably, the keyboard may include memory add, memory subtract, memory recall and memory clear keys for operation with a user accessible memory for the calculator function. The keyboard also includes a CLEAR key for clearing the display as with a typical calculator. The keyboard, in addition to the typical calculator keys, includes a COLON key for use in entering dates and times as explained hereafter. The keyboard also includes nine keys which enable entry of initial energy data and recall of logged energy data as explained hereafter. Those keys are labeled, for example, KW, MCF, GALS, TIME, DATE, ENTER, CANCEL SELECTION, START DATE and END DATE.

Figure 2:
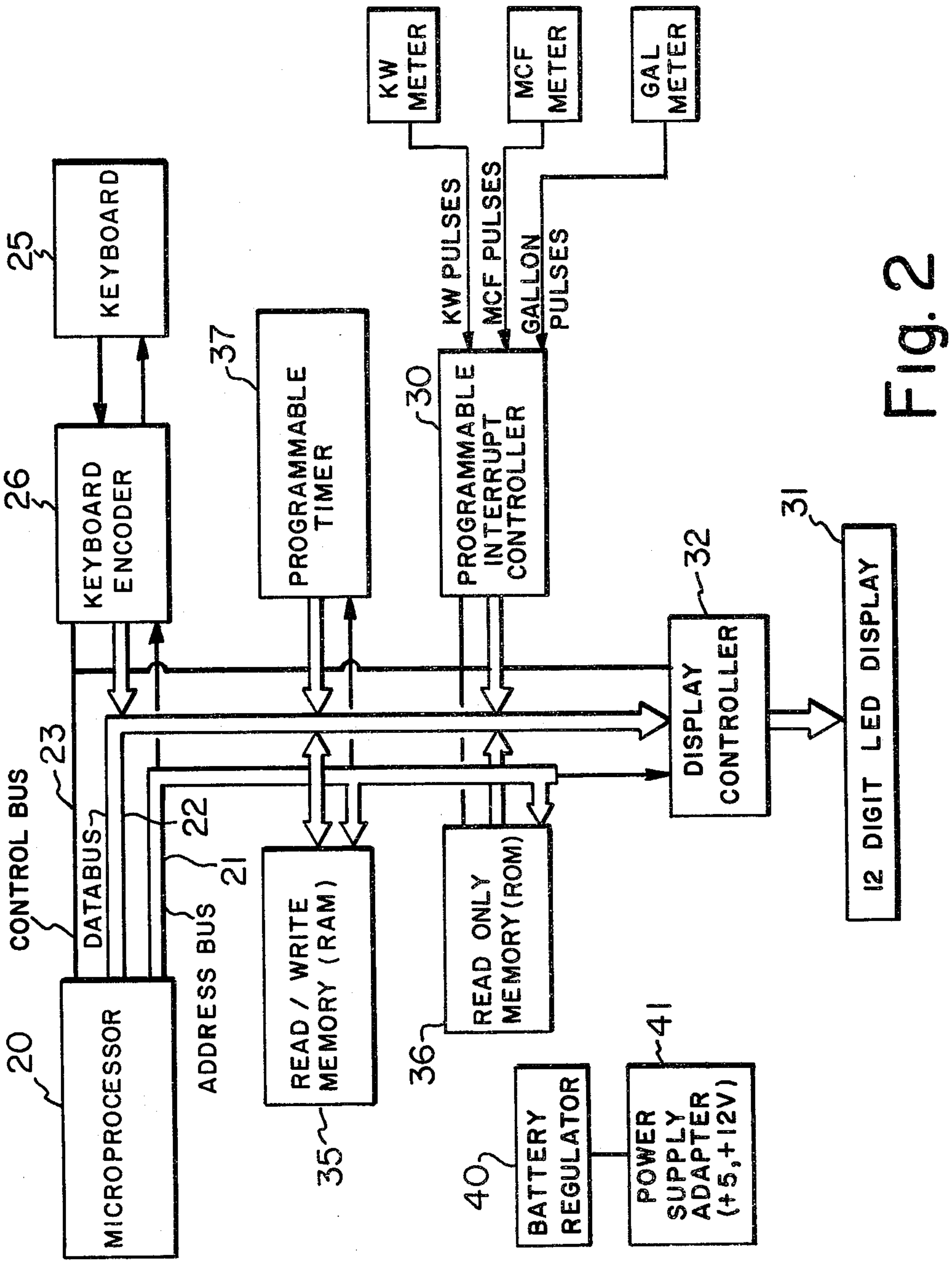

Referring now to FIG. 2, there is shown a block diagram of the digital electronic components or microcomputer according to this invention. The microcomputer comprises a microprocessor 20 interconnected to the remaining elements of the circuit by an address bus 21, a data bus 22, and a control bus 23. Input is through a keyboard 25 and keyboard encoder 26. The keyboard comprises a plurality of contact closures and, in the example described, thirty-one key-operated contact closures. Pulsed inputs indicative of energy usage are inputted through an interrupt controller, preferably a programmable interrupt controller 30. The programmable interrupt controller has at least three input terminals and typically eight input terminals available for receiving pulsed inputs. Output is provided, for example, by a twelve digit, four-segment LED display or the like interfaced with the above described buses by a display controller 32. Supporting the microprocessor is a read/write memory (RAM) 35 connected to the three buses. Typically the RAM is provided with 4,096 eight bit memory locations. Also associated with the microprocessor is a read-only memory (ROM) 36 attached to the three buses. The read-only memory is permanently programmed with the various tasks described in detail hereafter.

Also cooperating with the microprocessor through the three above described buses is a programmable timer 37. The programmable timer is used to provide time increment data for updating time of day/date information. The timer is essentially a down counter driven by a 60-cycle clock pulse. The value sixty is stored in a register that will be decremented to zero once per second and when the register times out, an interrupt is generated by the timer.

The entire system is battery powered; however, 110-volt A.C. power input is rectified and used to constantly recharge the battery. If the A.C. power is discontinued or shut-down, the power supply via the batteries will continue to output without loss or disruption of data stored in the apparatus for approximately 24 hours. The battery regulator 40 is further connected to a power supply adapter 41 which outputs the various D.C. voltage signals required by the system, for example plus 5 volts and plus 12 volts.

The operation of the hardware is controlled by the tasks or programs permanently stored in the read-only memory. The individual instructions of the tasks will vary depending upon the particular microprocessor selected and the particular peripheral processors integrated with the microprocessor. Substantially any eight-bit microprocessor having an interrupt capability is suitable for the purposes of this invention. The following hardware is considered suitable for implementation of this invention.

| INTEGRATED CIRCUIT TYPE | PREFERRED EMBODIMENT |
|---|---|
| Microprocessor | National Semiconductor INS8080A 8 bit, 40 pin DIP |
| ROM | National Semiconductor MM52132 4Kx8 NMOS 24 pin DIP |
| RAM | National Semiconductor MM2114-4 1Kx4K NMOS 18 pin DIP |
| Programmable Timer | National Semiconductor INS 8253 3 part programmable timer/set |
| Interrupt Controller | National Semiconductor INS 8259 8-level vectored priority interrupts. 28 pin DIP |
| Keyboard Encoder | National Semiconductor INS 8244 90 contact debounce/encoder 40 pin DIP |
| Display Controller | National Semiconductor |

-continued

| INTEGRATED CIRCUIT TYPE | PREFERRED EMBODIMENT |
|---|---|
| | INS 8247 7 segments, segment drive, digit multiplex control. |

There already exist a number of devices which generate output pulses corresponding to gas flow. For example, remote read-out instruments which adjust to provide one pulse for one to one million cubic feet of gas are manufactured and sold by Rockwell under the trade name ACT-PAK. Similar liquid meters which adjust to output pulses every one to five cubic centimeters, for example are manufactured and sold by Brooks under the trade name "Micro Oval 11 Flowmeters." Still further, there exist pulse initiating electric meters.

Figure 3:
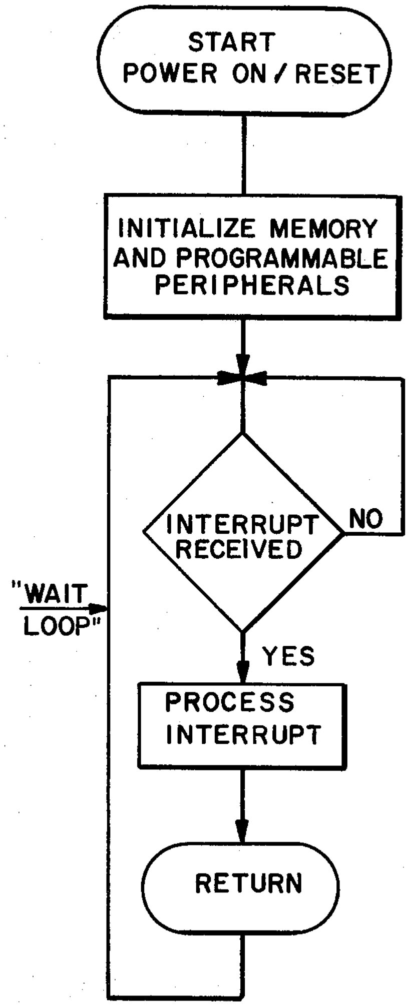

Referring now to FIG. 3, there is illustrated the main task for controlling the entire system. After power on, the main task initializes selected memory locations, and then initializes the programmable peripherals in a manner understood to those skilled in the art. The main task then enters a "wait loop" and the microprocessor simply waits for an interrupt before performing any other task. Upon receipt of an interrupt, the interrupt is processed and thereafter, control is returned to the "wait loop." In other words, the operation of the entire apparatus is interrupt driven. Interrupts that remove control from the "wait loop" and cause the microprocessor to perform other tasks are generated in three ways: They are generated by the operator through the keyboard, by the programmable timer, and by the receipt of a pulse from the various energy metering devices connected to the system. There are a number of functions, selections, and operations which may be called into operation from the keyboard via the keyboard interrupt. Also, where more than one energy metering device is connected to the apparatus, there will be a corresponding interrupt generated, each calling into operation a somewhat different interrupt handling task.

Figure 4:
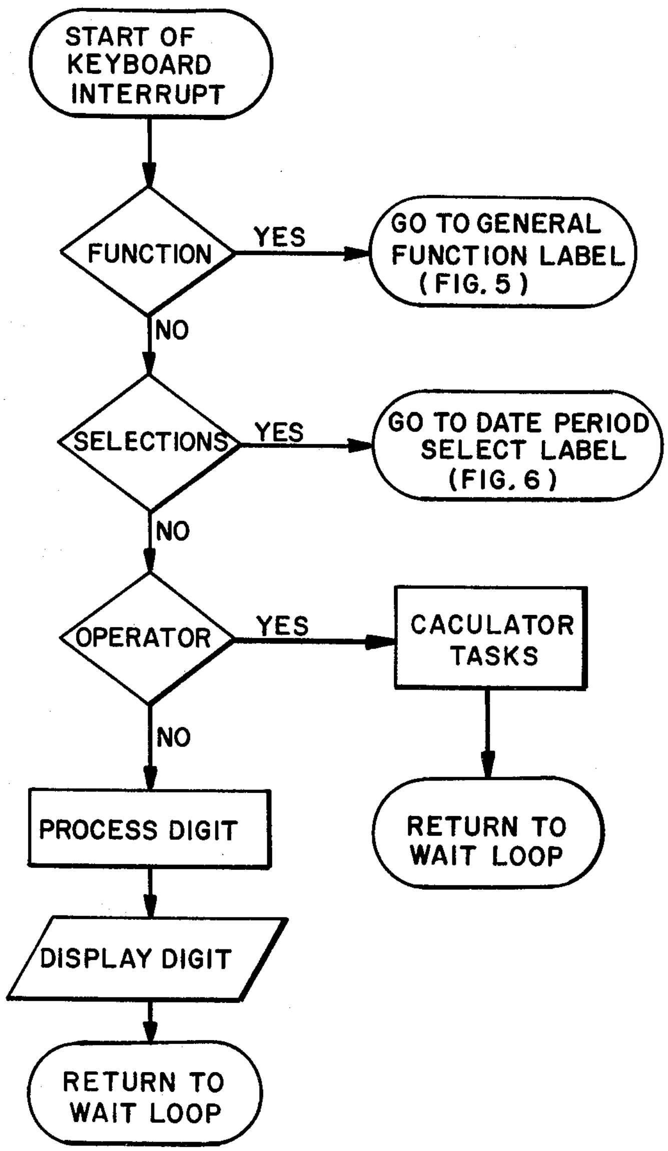

FIGS. 4 through 7 are flow diagrams relating to the keyboard interrupt initiated tasks. FIG. 4 is a flow diagram which illustrates the overall organization of tasks initiated by keyboard interrupts. When a keyboard interrupt is received, a test is first conducted to determine whether the key closed relates to a function. Function keys included the TIME, DATE, ENTER, KW, MCF and GALS keys. If the key struck is a function key, control is moved to the general function task which will be explained with reference to FIG. 5 hereafter. If not, a test is conducted to determine whether the key closed is a selection key. The selection keys include the START DATE, END DATE and CANCEL SELECTION keys. If the key struck is a selection key, control is transferred to the date period selection task described with reference to FIG. 6 hereafter. If not, a test is conducted to determine whether the key closed is an operator key. The operator keys include the mathematical function keys, including the four memory operation keys. If the key struck was an operator key, control is transferred to calculator tasks which are not described in this specification since they are well understood to those skilled in the art. Upon conclusion of any task, control is transferred to the "wait loop."

If the tests for function, selection, and operation keys result in three negative answers, the key struck must be one of the numeral keys 0 to 9, decimal point, and colon. In this case, the numeral is processed and displayed. It is, of course, stored in a display table which comprises memory locations in the read/write memory. A suitable subtask stored in the read-only memory and the display controller 32 cause the data in the display table to be translated into seven segment LED display characters. After the digit is displayed, control is returned to the "wait loop."

Figure 5:
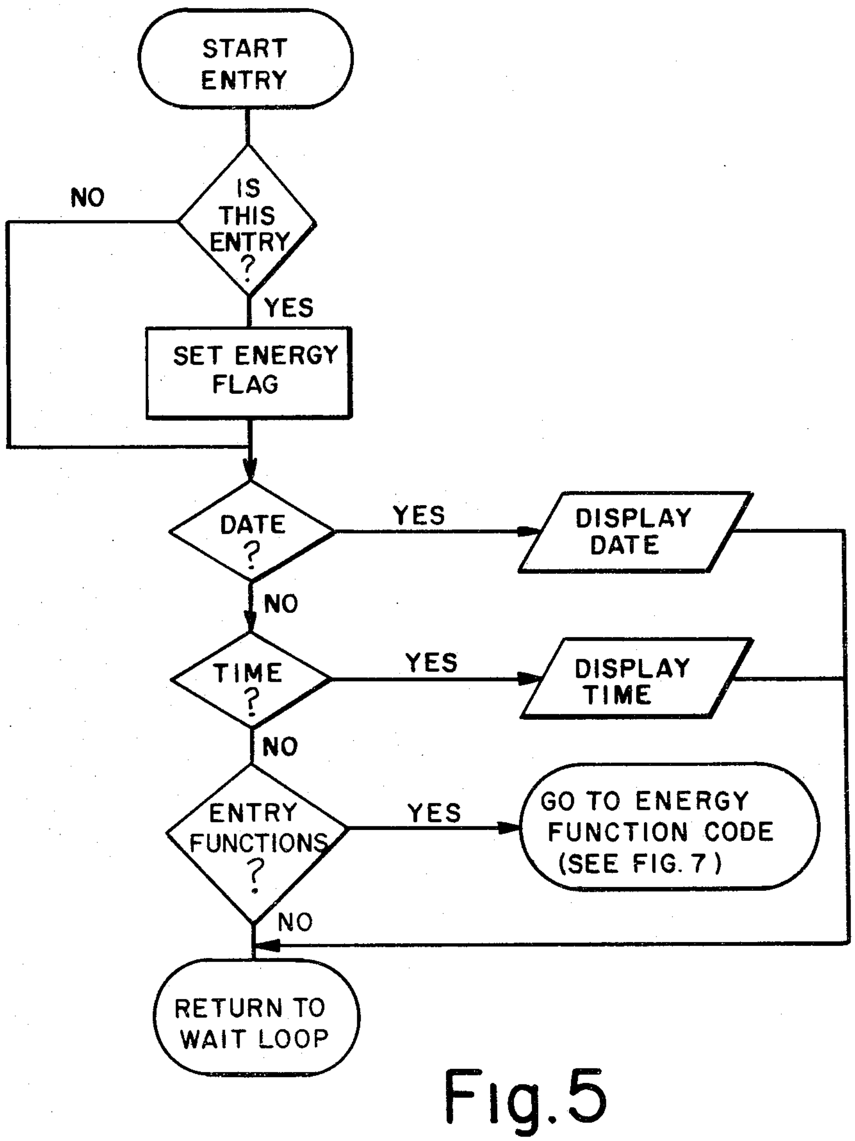

Referring to FIG. 5, there is illustrated the general function task. This task is used to call up a display or to enter a number on display (and therefore stored in the display table) at an initial value location in the read/write memory. Upon entering the general function task, a test is conducted to determine whether the ENTER key has been closed. If so, the entry flag is set. Next a test is conducted to determine whether the DATE key was closed. If so, control is transferred to the display date routine which causes the dates stored at a current date location in the read/write memory to be transferred to the display table and to be presented on the display. The way in which the current date memory location in read/write memory is maintained is described hereafter with reference to the clock interrupt task and FIG. 8.

Returning to the general function task, if the DATE key was not closed, a test is conducted to determine whether the TIME key was closed. If so, a current time is caused to be displayed in a manner similar to that in which the current data is displayed when the DATE key is closed. If neither the DATE nor TIME keys were closed, a test is conducted to determine whether one of the energy function keys was closed. If so, control is transferred to the energy function subtask which is described hereafter with reference to FIG. 7. Upon completion of any task initiated by keyboard interrupt, return is to the "wait loop".

Figure 6:
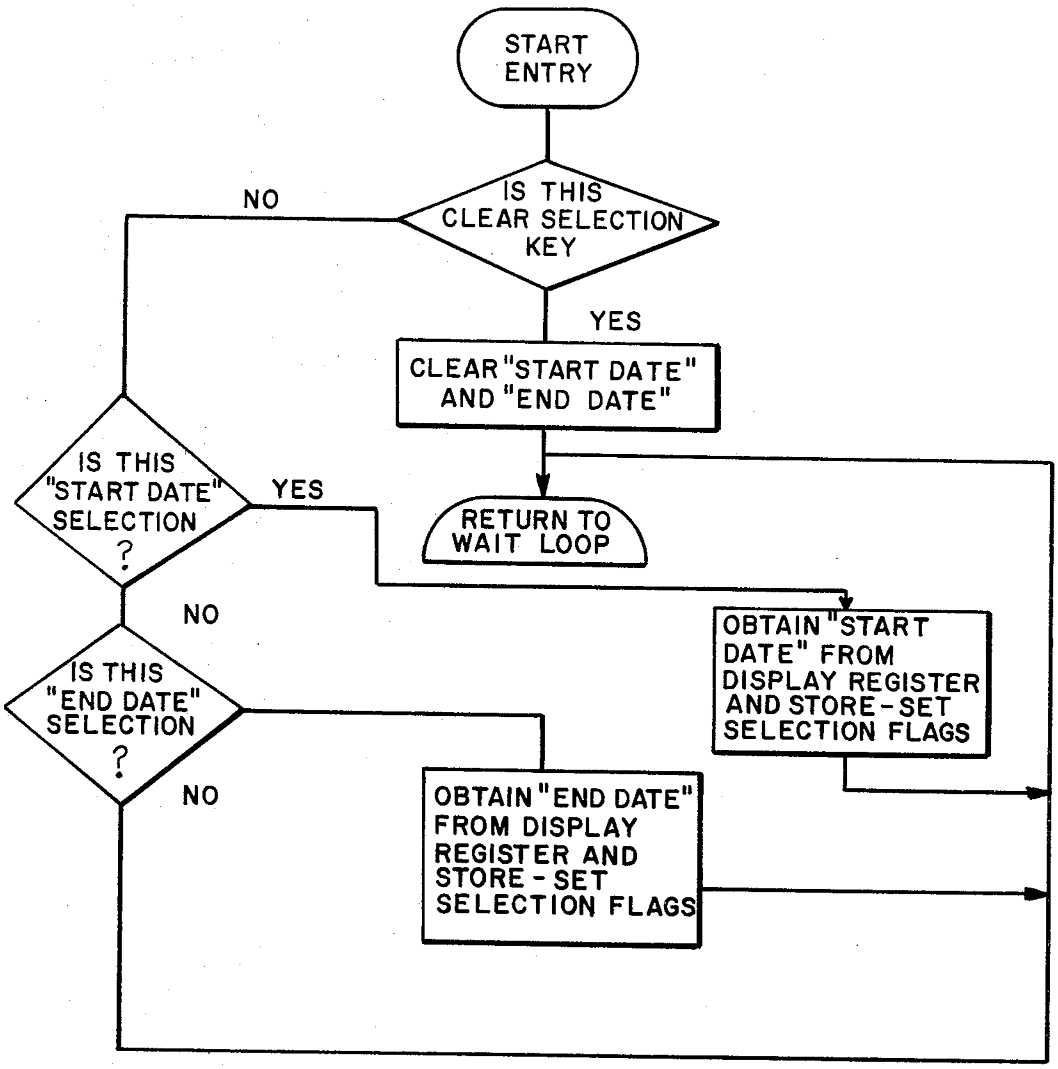

Referring now to FIG. 6, the date period select task is described. Upon entry into the routine, a test is conducted to determine whether the CLEAR SELECTION key has been struck. If it has, then control is transferred to a task for clearing the start-date and the end-date. The start-date is an identification of a date which is the start of a period for which the operator desires to ascertain the total energy usage. The end-date is the identification of a date concluding that period. If the CLEAR SELECTION key has not been closed, a test is then conducted to determine whether the START DATE selection key was closed. If so, control is transferred to a task which obtains the date currently displayed in the display register and therefore stored in the display table and stores that date at the start-date location in the read/write memory. Also, certain selection flags are set to record that the start-date selection has been made.

If neither the CLEAR SELECTION key nor the START DATE selection key was closed, the date period select task tests to determine whether the END DATE selection key was closed. If so, control is transferred to a task which obtains the date on display and therefore stored in the display table and transfers it to an end-date location in the read/write memory. Also, certain selection flags are set to record that the end date has been selected. Exit from the date period select task is to the "wait loop".

Figure 7:
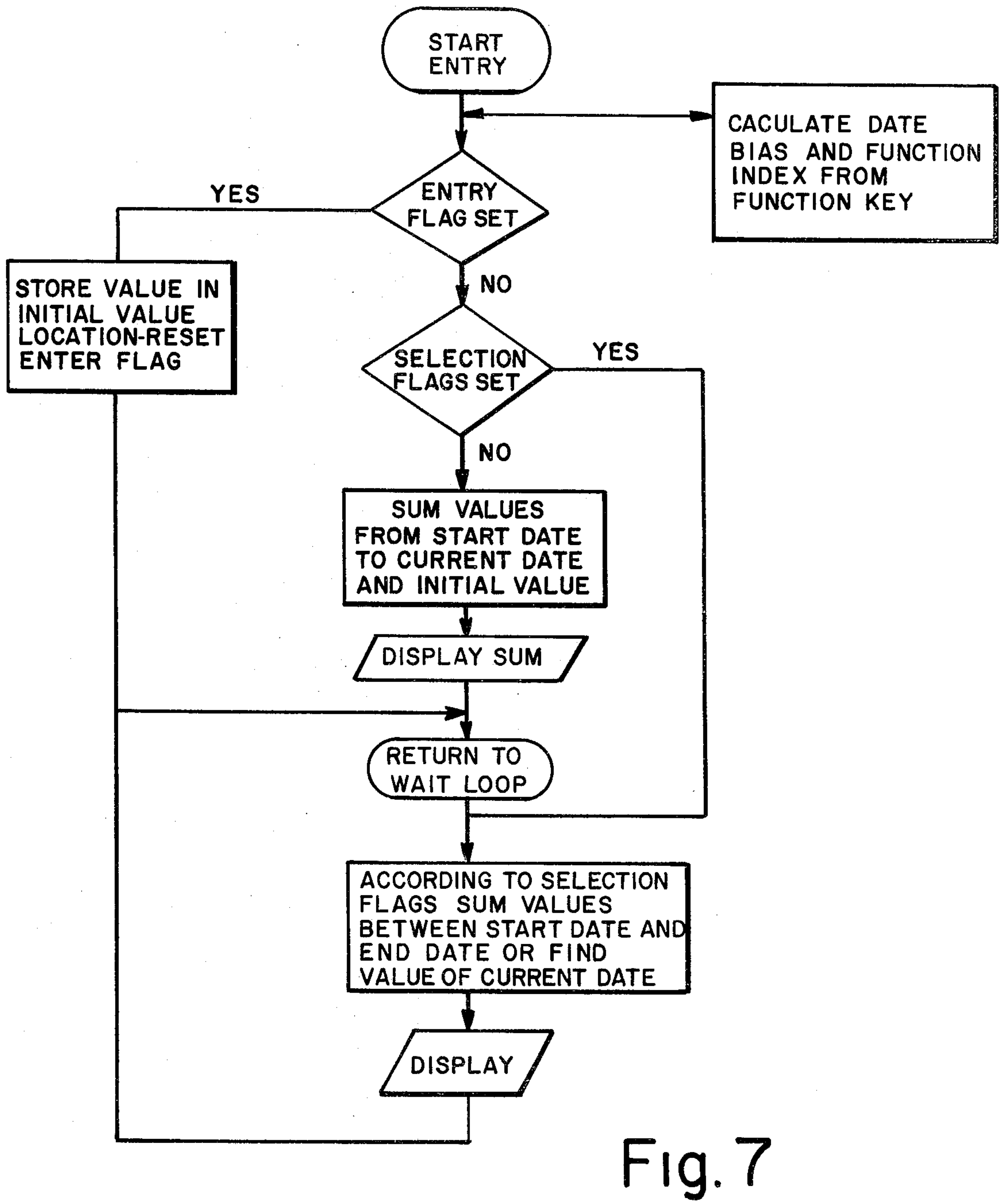

FIG. 7 relates to the energy function subtask. Upon entry into this subtask, a date bias and a function index are calculated from the function key. At this time, a test is conducted to see whether the entry flag has been set. If so, the value stored in the display register is transferred to an initial value location in the read/write memory which is identified by the date bias and function index previously calculated. Thereafter, the entry flag is reset.

If upon entering the energy function subtask, it is found that the entry flag is not set, then a test is conducted of the selection flags. If the selection flags are not set, control is transferred to a routine which sums the values from the start-date or the first date upon which data was accumulated to the current date and adds the initial value if any. The sum is then transferred to the display table and then to the display register whereupon it is displayed.

If, upon entering the energy function subtask, the entry flag is not set and the selection flags are set, then control is transferred to a routine which, according to the selection flags either sums the value between the start-date and end-date or finds the value at the start-date and end-date, if they are the same, and transfers the value to the display table whereupon it is displayed on the display register. Exit from the various operations in the energy function subtask are all to the "wait loop".

Figure 8:
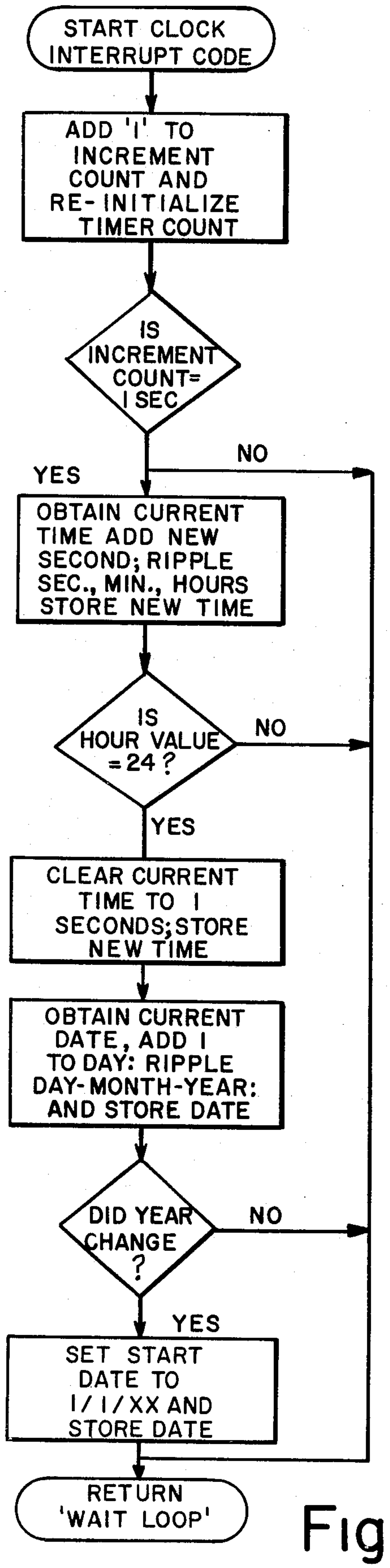

Referring now to FIG. 8, there is illustrated the clock interrupt task. Upon entry caused by a timer interrupt, one unit is added to increment the count and the timer is reinitialized as by storing sixty in its decrementable register. Thereafter, a test is conducted to determine whether the incremented count equals one second. If so, the current time is obtained and a new second added thereto. If necessary, the minutes and hours will also be adjusted. The remainder of the routine illustrated in FIG. 8 is self-explanatory illustrating how the date and year are changed when required in response to the interrupt indicative of the last second in a day or year. Exit from the clock interrupt task is to the "wait loop".

Figure 9:
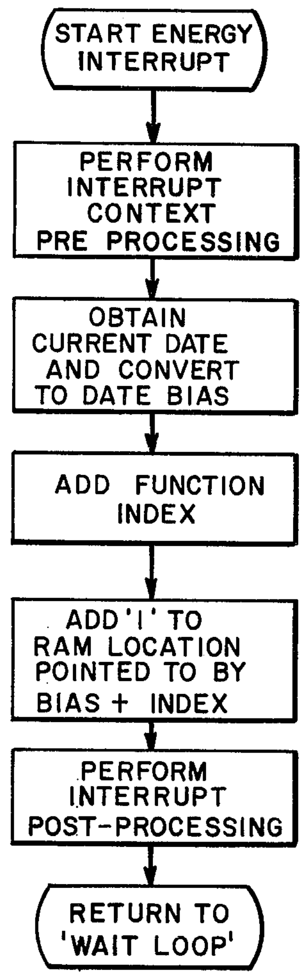

With reference to FIG. 9, there is shown the energy interrupt task which is a routine entered upon the receipt of a pulse from one of the plurality of pulse generating and energy metering devices connected to the apparatus. A plurality of similar codes are required, one for each type of energy being monitored. Upon receipt of an interrupt generated by an energy metering device, the current date is obtained and converted to a date bias. Thereafter, the function index indicative of the particular metering device generating the interrupt is added to the date bias. This sum identifies the location in the read/write memory (RAM) assigned to that type of energy for that date. Thereafter one is added to the read/write memory location and return is to the "wait loop". In this way, tables are built in the read/write memory in which the columns may be considered energy type and the rows may be considered to correspond to the particular date in sequence.

OPERATION

Pulses are continually received from the energy metering devices and are processed as interrupts. Each pulse is basically an increment of one to be added to the accumulating count for the particular energy value for the interrupting device. The apparatus calculates from the current date the appropriate location within the read/write memory (RAM) where the increment for the interrupt should be added. Thus, as the date changes, a different location within the read/write memory will be incremented giving a day-to-day accumulative account for the energy values for each of the plurality of energy metering devices being monitored.

The keyboard enables the user to interface with the system and to input and call up data to be displayed on the register. The keyboard, as already explained, is composed of a standard 17-key calculator pad with a colon key for time or date entry, four memory keys, six function keys, three selection keys, and a clear display register key. Usage of the keyboard is as follows:

To enter an initial value for any of the particular energy functions being recorded, the operator depresses the CLEAR key, enters via the keyboard the desired numerical value, depresses the ENTER key and then depresses the key, for example KW, MCF, GALS, indicative of the energy type for which the initial value is being entered.

To enter time to initialize the current time register, one depresses the CLEAR key and enters two digits for hours, depresses the COLON, enters two digits for minutes, depresses the COLON, and enters two digits for seconds. Thereafter the operator depresses the ENTER key and then the TIME function key.

To initialize the date in the current date register, one follows substantially the same procedure as for entering time except that the month, day and year numerals are separated by colons. After depressing the ENTER function key, the DATE function key is depressed.

To calculate and display year-to-date the values stored in the energy tables, the operator simply depresses the energy type function keys, for example, KW, MCF or GALS.

To display the current time, the operator simply depresses the TIME function key. To display the current date, the operator simply depresses the DATE function key.

To calculate and display the values stored in the energy tables for a particular type of energy being monitored from a start-date to an end-date, one first enters the start-date as described above and enters an end-date as described above. Thereafter, by depressing one of the energy type function keys, the values between the start-date and end-date for the particular energy type stored in the read/write memory are summed and displayed. If the value for a particular date is desired, the operator follows the procedure for entering the start-date and immediately strikes the end-date function key. Thereafter, by depressing one of the energy-type function keys, the value stored in the energy table for that date and that type of energy will be displayed. To cancel the start-date and/or end-date selection, the operator simply depresses the CANCEL SELECTION key.

The remaining keys are operated as on a typical hand calculator.

Apparatus for generating pulses indicative of gas usage, fuel-oil usage, and electrical power usage are commercially available. These pulses are suitable for application to the terminals of the interrupt controller.

In the case of electrical usage, suitable devices may have a shutter driven by the standard meter disc through a gear train which shutter cooperates with at least one LED light source and a phototransistor to actuate a transistorized flip-flop, the output of which is amplified and used as a digital interrupt signal. The use of rotating magnets driven by the meter disc and Hall effect switches to activate the transistor flip-flop is also practical.

Flow meters for measuring gas and oil usage include positive displacement meters of the nutating disc, lobed impeller, rotary vein, and gear-types as well as meters (not of the positive displacement type) having an element that rotates at a speed linear with fluid velocity including, for example, propeller, turbine and vortex meters. Apparatus means for converting the rotation of the rotating mechanical elements of flow meters into an electrical pulse are numerous. For example, a magnet may be mounted to the rotating element and a circuit with a read switch placed relative to the rotating elements such that every time a magnet passes close to the read switch, a circuit is completed and a pulse is generated.

Having thus defined our invention with the detail and particularity required by the Patent Laws, what is desired protected by Letters Patent is set forth in the following claims.

I claim:

1. A digital apparatus for generating a log of energy usage for instant recall and analysis comprising:
(a) a microprocessor having an interrupt capability with associated read-only memory, read/write (RAM) memory, data, address, and control buses;
(b) a timer connected with said microprocessor to provide continuous real-time/date data;
(c) a keyboard and keyboard encoder connected with said microprocessor for establishing certain initial conditions in the read/write memory and for selecting certain displays and functions;
(d) a display and display controller connected with said microprocessor for displaying data;
(e) an interrupt controller connected with said microprocessor, said interrupt controller having a plurality of input terminals connectable with the pulse outputs of energy metering devices;
said read-only memory permanently programmed
(i) with a task to cause the microprocessor to have a continuously updated date and time stored at a selected location in the read/write memory,
(ii) with a task to process each interrupt corresponding to each pulsed input to add one unit to a read/write memory location corresponding to the date and the particular input terminal, and
(iii) with a task to select and display the contents of the memory locations corresponding to date or dates and particular input terminals.

2. The apparatus according to claim 1 in which the display is a multiple digit seven segment LED display.

3. The apparatus according to claim 1 in which at least two of the input terminals associated with the interrupt controller are connected to pulse generating-energy metering devices.

4. The apparatus according to claim 1 in which the keyboard contains typical calculator keys and the read-only memory is further permanently programmed
(iv) with tasks to perform addition, subtraction, multiplication and division.

5. A system for monitoring energy usage comprising
at least one pulse generating metering device outputting digital pulses indicative of one type of energy usage and
a digital apparatus for generating a log of energy usage for instant recall and analysis comprising:
(a) a microprocessor having an interrupt capability with associated read-only memory, read/write (RAM) memory, data, address, and control buses;
(b) a timer connected with said microprocessor to provide continuous real-time/date data;
(c) a keyboard and keyboard encoder connected with said microprocessor for establishing certain initial conditions in the read/write memory and for selecting certain displays and functions;

(d) a display and display controller connected with said microprocessor for displaying data;

(e) an interrupt controller connected with said microprocessor, said interrupt controller having a plurality of input terminals connected to the at least one pulse generating metering device;

said read-only memory permanently programmed (i) with a task to cause the microprocessor to have a continuously updated date and time stored at a selected location in the read/write memory, (ii) with a task to process each interrupt corresponding to each pulsed input to add one unit to a read/write memory location corresponding to the date and the particular input terminal, and (iii) with a task to select and display the contents of the memory locations corresponding to date or dates and particular input terminals.

6. A system according to claim 5 wherein the real-time/date data can be displayed upon the display providing a desk clock/calendar.

* * * * *